US009293529B2

(12) United States Patent
Kautzsch

(10) Patent No.: US 9,293,529 B2
(45) Date of Patent: Mar. 22, 2016

(54) SEMICONDUCTOR DEVICE WITH AN ARRAY OF LAMELLAS AND A MICRO-ELECTRO-MECHANICAL RESONATOR

(71) Applicant: Infineon Technologies Dresden GmbH, Dresden (DE)

(72) Inventor: Thoralf Kautzsch, Dresden (DE)

(73) Assignee: Infineon Technologies Dresden GmbH, Dresden (DE)

( * ) Notice: Subject to any disclaimer, the term of this patent is extended or adjusted under 35 U.S.C. 154(b) by 43 days.

(21) Appl. No.: 13/945,113

(22) Filed: Jul. 18, 2013

(65) Prior Publication Data

US 2015/0021734 A1   Jan. 22, 2015

(51) Int. Cl.
*H01L 29/00* (2006.01)
*H01L 29/06* (2006.01)
*H01L 21/762* (2006.01)
*H03H 3/007* (2006.01)
*H03H 9/24* (2006.01)
*H03H 9/02* (2006.01)

(52) U.S. Cl.
CPC ...... *H01L 29/0649* (2013.01); *H01L 21/76202* (2013.01); *H03H 3/0072* (2013.01); *H03H 9/2452* (2013.01); *H03H 3/0073* (2013.01); *H03H 2009/02307* (2013.01); *H03H 2009/02346* (2013.01); *H03H 2009/02496* (2013.01)

(58) Field of Classification Search
CPC ...................... H01L 21/76202; H01L 29/0649
See application file for complete search history.

(56) References Cited

U.S. PATENT DOCUMENTS

| 8,013,493 | B2 | 9/2011 | Van Der Avoort |
| 8,143,971 | B2 | 3/2012 | Beek |
| 2011/0140216 | A1* | 6/2011 | Qu ............................ 257/419 |
| 2012/0068277 | A1* | 3/2012 | Kautzsch et al. ............ 257/418 |
| 2012/0094456 | A1 | 4/2012 | Wang |

OTHER PUBLICATIONS

Application and File History for U.S. Appl. No. 13/722,248, filed Dec. 20, 2012, Inventors: Kautzsch et al.
Vigna, Benedetto, *Physical Sensors Drive MEMS Consumerization Wave*, 11 pages, dated Oct. 18, 2007.

* cited by examiner

*Primary Examiner* — Howard Weiss
(74) *Attorney, Agent, or Firm* — Schiff Hardin LLP

(57) ABSTRACT

A semiconductor device includes a silicon substrate layer with a decoupling region. The decoupling region of the silicon substrate layer comprises an array of lamellas laterally spaced apart from each other by cavities. Each lamella of the array of lamellas comprises at least 20% silicon dioxide.

8 Claims, 6 Drawing Sheets

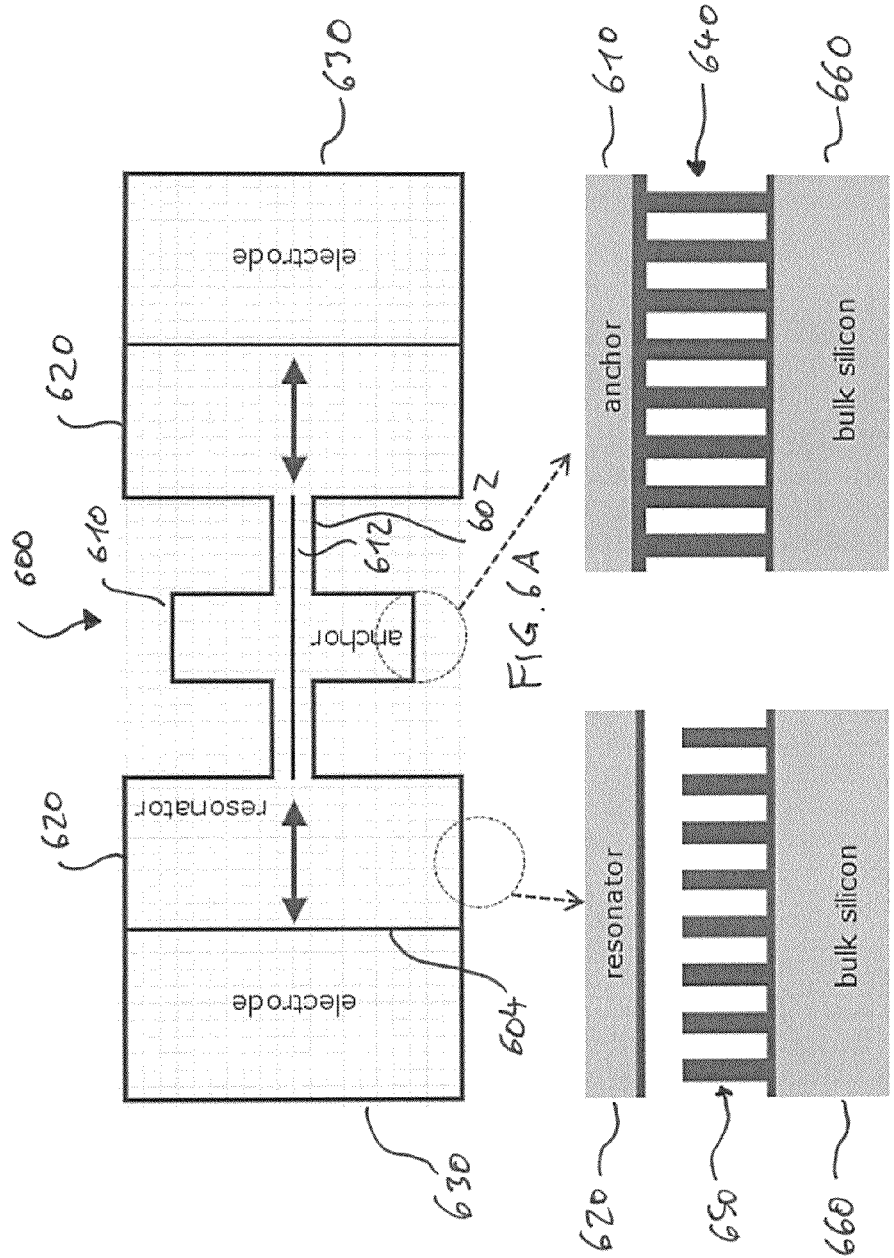

US 9,293,529 B2

SEMICONDUCTOR DEVICE WITH AN ARRAY OF LAMELLAS AND A MICRO-ELECTRO-MECHANICAL RESONATOR

TECHNICAL FIELD

Embodiments relate to the field of semiconductor technologies and in particular to a semiconductor device, a micro-electro-mechanical resonator and a method for manufacturing a semiconductor device.

BACKGROUND

Nowadays, a large variety of different electronic devices are available. Most of these devices comprise elements or structures which should be electrically or capacitive decoupled from other elements or structures. For example, many applications and electronic devices apply AC signals (alternating current) to transmit data or perform readouts of sensor systems or actuators. The sensitivity of capacitive readout is reduced by parasitic elements. These elements may be bond pads or wiring to bulk silicon configurations or cross-talk of silicon material that is arranged side-by-side of the surface at the device. Such parasitic capacities should be kept low to reduce switching losses or increase the switching speed of a device. Similarly, also undesired electrically-conductive paths should be kept low to reduce leakage currents.

SUMMARY

A semiconductor device according to an embodiment comprises a silicon substrate layer with a decoupling region. The decoupling region of the silicon substrate layer comprises an area of lamellas laterally spaced apart from each other by cavities. Each lamella of the array of lamellas comprises at least 20% silicon dioxide.

The composite structure of lamellas and cavities comprises a very low permittivity so that a good capacitive decoupling of elements arranged at opposite sides of the decoupling region (e.g. bulk silicon below and metal layers above the array) can be implemented. In this way, switching losses can be reduced and/or the switching speed can be increased. Further, the cavities and the silicon dioxide of the lamellas are electrical insulating structures so that a good electrical decoupling of elements at opposite sides of the decoupling region may be implemented. In this way, leakage currents may be reduced or kept low.

In some embodiments, a lamella of the array of lamellas comprises a lateral length between 200 nm and 10 µm, a lateral thickness between 20 nm and 500 nm and a vertical depth between 500 nm and 100 µm. The portion of cavities within the array of lamellas can be kept high. Consequently, by using small lamellas, the permittivity of the decoupling region may be very low.

In some embodiments, each lamella of the array of lamella consists of more than 80% silicon dioxide. In this way, remaining electrically conductive material within the lamellas can be kept low so that the electrical and/or capacitive decoupling can be improved.

Some embodiments relate to a micro-electro-mechanical resonator comprising a resonator structure. The resonator structure comprises at least one resonator area and at least one anchor area. The resonator area is arranged next to an electrode for stimulating an oscillation of the resonator structure. Further, an array of lamellas with at least one row of lamellas connects the anchor area laterally to a silicon substrate layer surrounding the resonator structure. The resonator structure and the array of lamellas is arranged above a common lateral cavity so that the resonator structure is connected to neighboring silicon solely through the array of lamellas connected to the anchor region.

Due to the levitating arrangement of the resonator structure above the lateral common cavity, the performance of the micro-electro-mechanical resonator can be improved and/or the micro-electro-mechanical resonator can be easily manufactured.

Some further embodiments relate to a method for manufacturing a semiconductor device. The method comprises manufacturing an array of lamellas laterally spaced apart from each other by trenches within a decoupling region of a silicon substrate layer. Further, the method comprises oxidizing the array of lamellas so that each lamella of the array of lamellas comprises at least 20% silicon dioxide.

By manufacturing trenches between lamellas and oxidizing the lamellas, a structure with good electrical and/or capacitive decoupling properties can be provided as mentioned above.

BRIEF DESCRIPTION OF THE FIGURES

Some embodiments of apparatuses and/or methods will be described in the following by way of example only, and with reference to the accompanying figures, in which:

FIG. 6a shows a schematic top view of a resonator structure.

FIG. 6b shows a schematic top view detail of the decoupling region next to a resonator area of the resonator structure shown in FIG. 6a.

FIG. 6c shows a schematic illustration of a top view detail of the decoupling region connecting an anchor region of the resonator structure shown in FIG. 6a.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figures 1A, 1B, 2:
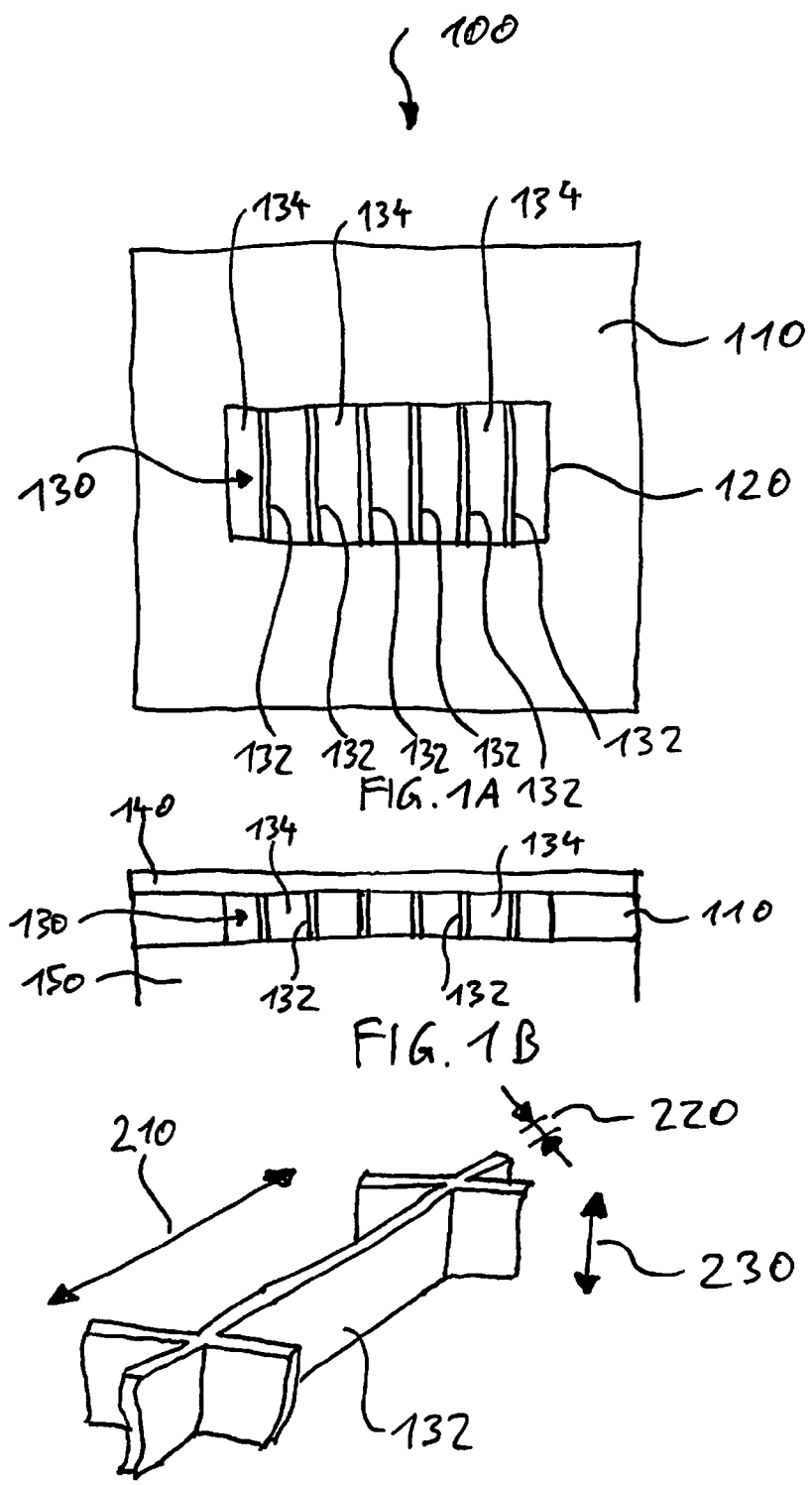
FIG. 1a shows a schematic top view of a semiconductor device.
FIG. 1b shows a schematic cross section of a semiconductor device.
FIG. 2 shows a schematic cross section of a lamella of an array of lamellas.

FIG. 1a shows a schematic illustration of a semiconductor device 100 according to an embodiment. The semiconductor device 100 comprises a silicon substrate layer 110 with a decoupling region 120. The decoupling region 120 of the silicon substrate layer 110 comprises an array 130 of lamellas laterally spaced apart from each other by cavities 134. Each lamella 132 of the array 130 of lamellas comprises at least 20% silicon dioxide.

Due to the combination of lamellas and cavities, the decoupling region 120 comprises a low permittivity. Therefore, a capacitive decoupling of elements laterally or vertically arranged on opposite sides of the decoupling region can be improved. Further, the decoupling region comprises only few or no electrically conductive paths between elements arranged at opposite sides of the decoupling region so that an electrical decoupling of these elements can be improved.

The semiconductor device 100 may be an arbitrary electric device manufactured on a semiconductor substrate using or requiring a region with improved electrical and/or capacitive decoupling properties in comparison to a silicon layer or a silicon dioxide layer, for example.

The silicon substrate layer 110 may build up a bulk silicon of the semiconductor device or an N- or P-doped silicon layer on top of a bulk silicon or on top of a buried oxide layer of a silicon-on-insulator substrate (SOI substrate). This silicon substrate layer 110 is used to manufacture the decoupling region 120 therein. In this way, the decoupling region represents a part of the silicon substrate layer 110 after manufacturing the semiconductor device 100. The cross-section of FIG. 1b shows an example of a silicon substrate layer 110 arranged on top of a bulk silicon 150. Alternatively, the silicon substrate layer 110 may build up also the bulk silicon 150, for example.

The decoupling region 120 may be an area of the silicon substrate layer 110 used for building up a structure for improved (e.g. better than silicon or silicon dioxide) electrical and/or capacitive decoupling of elements located on opposite sides of the decoupling region 120. The decoupling region 120 may extend at least over the array 130 of lamellas laterally spaced apart from each other by cavities 134 (e.g. the area of lamellas may represent the decoupling region). Optionally, the decoupling region 120 may comprise more than one array of lamellas or also other structures with improved capacitive or electrical decoupling properties (e.g. in comparison to silicon or silicon dioxide).

The array 130 of lamellas may comprise an arbitrary number of lamellas arranged in various ways. However, the array 130 of lamellas comprises at least three lamellas arranged in an ordered or regular pattern (e.g. in one row or another one-dimensional or two-dimensional pattern). The array of lamellas may be a line array (e.g. one row of lamellas) or a two-dimensional arrangement of lamellas (e.g. columns and lines of lamellas).

A lamella (also called blade or fin.) may be a three-dimensional structure comprising a significant larger extension or expansion in one lateral direction than in the other (orthogonal) lateral direction and in the vertical direction. For example, a lamella may extend in one lateral direction at least twice as far as the extension in the other (orthogonal) lateral direction and more than twice as far as the extension in the vertical direction.

A main surface of the semiconductor device 100 may be a surface of the silicon substrate layer 110 of the semiconductor device 100 towards metal layers, insulation layers or passivation layers on top of the silicon substrate layer 110. In comparison to a basically vertical edge (e.g. resulting from separating the semiconductor device from others) of the semiconductor device 100, the main surface of the semiconductor device 100 may be a basically horizontal surface. The main surface of the semiconductor device 100 may be a basically even plane (e.g. neglecting unevenness of the silicon substrate layer due to the manufacturing process). In other words, the main surface of the semiconductor device 100 may be the inter-face between the silicon substrate and an insulation layer, metal layer or passivation layer on top of the silicon substrate.

In view of this definition, a layer of the semiconductor device 100 may basically expand in two lateral directions and comprises a thickness measured orthogonally to the lateral directions. Further, a lateral dimension of an element (e.g. lateral length or lateral thickness of a lamella or lateral width of a cavity) may expand in parallel to the main surface and a vertical dimension of an element (e.g. vertical depth of a lamella) may expand orthogonal to the main surface.

The lamellas 132 of the array 130 of lamellas are spaced apart from each other by cavities. The cavities may extend vertically from the bottom of neighboring lamellas to the top of neighboring lamellas. The cavities may be filled with gas (e.g. air or nitrogen).

Each lamella 132 of the array 130 of lamellas comprises at least 20% silicon dioxide. Silicon dioxide comprises a low permittivity and is an electrically insulating material (e.g. in comparison to metals or semiconductors). In many applications, it may be sufficient to implement lamellas with at least 20% silicon dioxide to obtain a sufficient capacitive and/or electrical decoupling. In other words, each lamella of the array 130 of lamellas may consist of at least 20% silicon dioxide.

Optionally, the portion of silicon dioxide of the lamellas can be higher to improve the capacitive and/or electrical decoupling. For example, each lamella of the array of lamellas may comprise at least 50%, at least 70%, at least 80% or at least 90% silicon dioxide or may consist of more than 50%, more than 70%, more than 80% or more than 90% silicon dioxide. Further optionally, each lamella 132 of the array 130 of lamellas may consist of silicon dioxide solely. In this connection, impurities (e.g. dopants or other elements) of less than 1% (or less than 0.1%) are neglected.

The silicon dioxide of the lamellas 132 may be manufactured in various ways. For example, the silicon dioxide of the lamellas 132 of the array 130 of lamellas is manufacturable or is manufactured by a thermal oxidation of the lamellas 132 of the silicon substrate layer 110. In other words, the lamellas may be manufactured within the silicon substrate layer 110 and may be thermally oxidized afterwards. The thermal oxidation may be stopped after at least 20% of the lamellas 132 is converted to silicon dioxide. As mentioned above, also larger portions of silicon dioxide may be desired. For example, the oxidation may be stopped after the lamellas comprise more than 50%, more than 70%, more than 80%, more than 90% or even 100% silicon dioxide (e.g. neglecting impurities due to implants or other impurities). In other words, each lamella of the array of lamellas may comprise less than 80% silicon material (or less than 50%, less than 30%, less than 20% or basically 0%) remaining after the thermal oxidation (e.g. not converted to silicon dioxide). Due to the thermal oxidation, the lamellas 132 of the array 130 of lamellas may be (completely) surrounded by silicon dioxide.

FIG. 2 shows a schematic three-dimensional illustration of a lamella 132 of an array of lamellas. In this example, a lateral length 210 of the lamella 132, a lateral thickness (or lateral width) of the lamella 132 and a vertical depth (or a vertical height) of the lamella 132 is indicated by the arrows. The lateral length, the lateral thickness and/or the vertical depth of a lamella 132 may vary in a wide range (e.g. depending on a required or desired magnitude of decoupling or stability of the structure). A lamella 132 of the array 130 (e.g. at least one, more than half of the lamellas of the array of lamellas or all lamellas of the array of lamellas) of lamellas comprises a lateral length between 200 nm and 10 µm (or between 500 nm and 5 µm or between 800 nm and 2 µm), a lateral thickness between 20 nm and 500 nm (or between 50 nm and 300 nm or between 80 nm and 150 nm) and a vertical depth between 500 nm and 100 µm (or between 1 µm and 50 µm), for example. The lateral length, the lateral thickness and/or the vertical depth may relate to an average, maximal or minimal lateral length, lateral thickness and/or vertical depth.

Further, also the dimensions of the cavity separating the lamellas 132 may vary in a wide range. For example, a cavity 134 (e.g. one cavity, more than 50% of the cavities of the array of lamellas or all cavities of the array of lamellas) laterally separating two neighboring lamellas 132 may comprise a lateral width (e.g. average, maximal or minimal lateral width) between 50 nm and 1 µm (or between 200 nm and 700 nm). Further, a cavity may comprise a vertical depth basically equal to a vertical depth of the neighboring lamellas 132. Further, depending on the geometrical arrangement of the lamellas 132, a cavity may comprise basically the equal lateral length than a lamella as it is shown in FIG. 1A, for example.

Optionally or additionally to one or more aspects mentioned above, a cavity 134 separating two neighboring lamellas 132 may comprise a larger lateral width than the lateral thickness of the neighboring lamellas 132. In this example, the portion of cavities 134 may be higher than the portion of lamellas 132 within the array 130 of lamellas so that the permittivity of the structure may be further reduced.

The cavities 134 separating the lamellas 132 may be sealed at both ends (the end facing a bulk silicon of the semiconductor device and an end opposite to a bulk silicon of the semiconductor device) as it is shown in FIG. 1B. For example, the cavities 134 laterally separating the lamellas 132 of the array 130 of lamellas may be sealed by a sealing layer 140 implemented by a silicon dioxide layer (e.g. high-density plasma oxide or tetraethyl orthosilicate oxide) or a carbon layer at an end opposite to a bulk silicon of the semiconductor device (or at an end facing an insulation layer, metal layer or passivation layer on top of the silicon substrate layer 110). Optionally, the complete array 130 of lamellas is covered or sealed by such a sealing layer 140.

At the bottom end of the cavities 134 representing an end facing a bulk silicon 150 of the semiconductor device 100, the cavities 134 may be sealed by the bulk silicon 150 as shown in FIG. 1B, for example. Alternatively, the silicon substrate layer 110 may be thicker than the vertical depth of the cavities 134 or lamellas 132 so that the cavities are sealed by the silicon substrate layer (110) itself at an end facing the bulk silicon formed by the silicon substrate layer 110.

Alternatively, the cavities 134 laterally separating the lamellas 132 of the array 130 of lamellas are connected (or open) to a common lateral cavity at an end facing a bulk silicon of the semiconductor device 100. In other words, a common lateral cavity is formed below the array 130 of lamellas. Such a structure may comprise an even lower permittivity for elements on opposite sides of the structure (e.g. between the bulk silicon and elements above the decoupling area) due to the additional common lateral cavity.

A lamella 132, some of the lamellas 132 or one or more support structures may reach from the array 130 of lamellas to the layer below the array 130 (e.g. bulk silicon) through the common lateral cavity.

Alternatively, the array 130 of lamellas may be arranged above a common lateral cavity so that the array of lamellas comprises solely a lateral connection to the surrounding silicon substrate layer 110. In other words, the array 130 of lamellas may levitate above the common lateral cavity without a vertical connection through the common lateral cavity. In this way, an improved capacitive decoupling and/or a complete electrical decoupling in vertical direction within the area 130 of lamellas may be provided.

Without a common lateral cavity, a high sheer stress at the bottom of the lamella may appear. This may be additionally avoided by using a cavity (common lateral cavity) like in a silicon-on-nothing structure, for example. In this way, only a lateral connection with bulk silicon (or the silicon substrate layer) may be present, for example.

The lamellas 132 of the array 130 of lamellas may be arranged in various ways. For example, the lamellas 132 are arranged in one row as shown in FIG. 1A.

Figure 3:
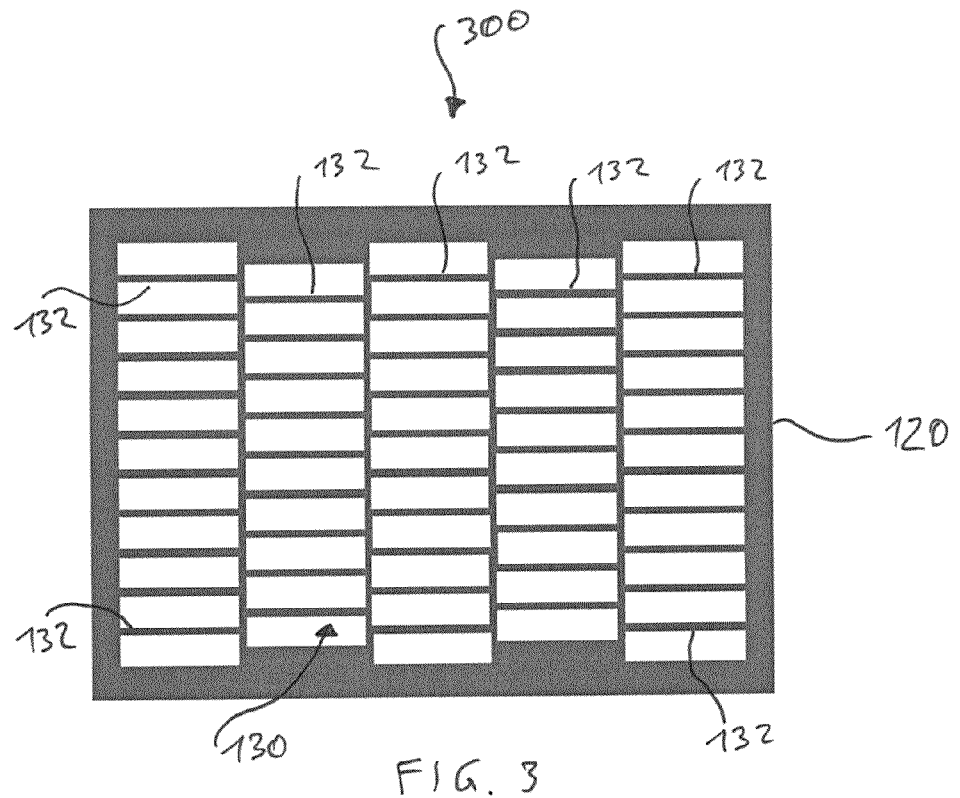
FIG. 3 shows a schematic top view of a decoupling region of a semiconductor device.

Alternatively, FIG. 3 shows a schematic top view of another semiconductor device 300 with a decoupling region 120 comprising a two-dimensional arrangement of lamellas 132 within an array 130 of lamellas. For example, the array 130 of lamellas may comprise a plurality of rows of lamellas 132. Two neighboring rows of lamellas may comprise a lateral offset (e.g. half the lateral width of the cavities or half the length of the cavities in the other direction).

In the example shown in FIG. 3, the array 130 of lamellas 132 comprises five rows of lamellas 132 each arranged with a lateral offset of half the lateral width of the cavities. In this example, a basic structure for a low-k composite layer represented by lamellas with a width of approximately 100 nm arranged in a grid structure is shown.

Figure 4:
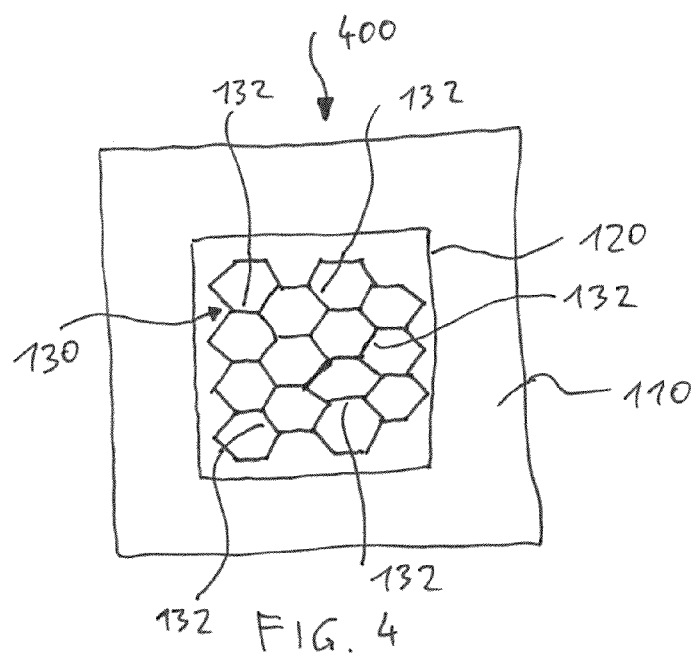
FIG. 4 shows a schematic top view of a semiconductor device.

Alternatively, FIG. 4 shows an embodiment of a semiconductor device 400 with a honeycomb-shaped lamella structure. In other words, the array of lamellas may comprise a lateral honeycomb structure (e.g. the cavities comprise a hexagonal geometry).

The structure of the array 130 of lamellas shown in FIG. 3 or 4 may be able to cope with the stress that may come along with thermal oxidation. This may also be done by other suited geometries for stress reduction. In other words, to avoid higher compressive stress in the lamella network a staggered grid structure may be used as shown in FIG. 3 or 4.

Optionally, additionally or alternatively to one or more aspects mentioned above, more than 50%, more than 80% or all lamellas and/or cavities may comprise the same lateral length, lateral width and/or lateral depth (e.g. neglecting variations due to manufacturing variations, e.g. less than 10% of an average lateral width, lateral length or vertical depth). For example, all cavities 134 and lamellas 132 of the array 130 of lamellas may comprise the same lateral width, lateral length and vertical depth.

As already mentioned, the decoupling area 120 with the array of lamellas 132 may improve the capacitive and/or electrical decoupling of elements arranged at opposite sides of the array 130 of lamellas 132. For example, the capacitive and/or electrical decoupling between bulk silicon and one or more metal layers or a pad on top of the semiconductor device can be improved. In other words, the semiconductor device 100 may optionally comprise an electrically-conductive structure (e.g. part of a metal layer or a pad) arranged above (e.g. on top of the main surface) the array 130 of lamellas so that the capacitive coupling of the electrically-conductive structure and a bulk silicon of the semiconductor device 100 below the array 130 of lamellas is weaker than without the array 130 of layers in between.

Figure 5:
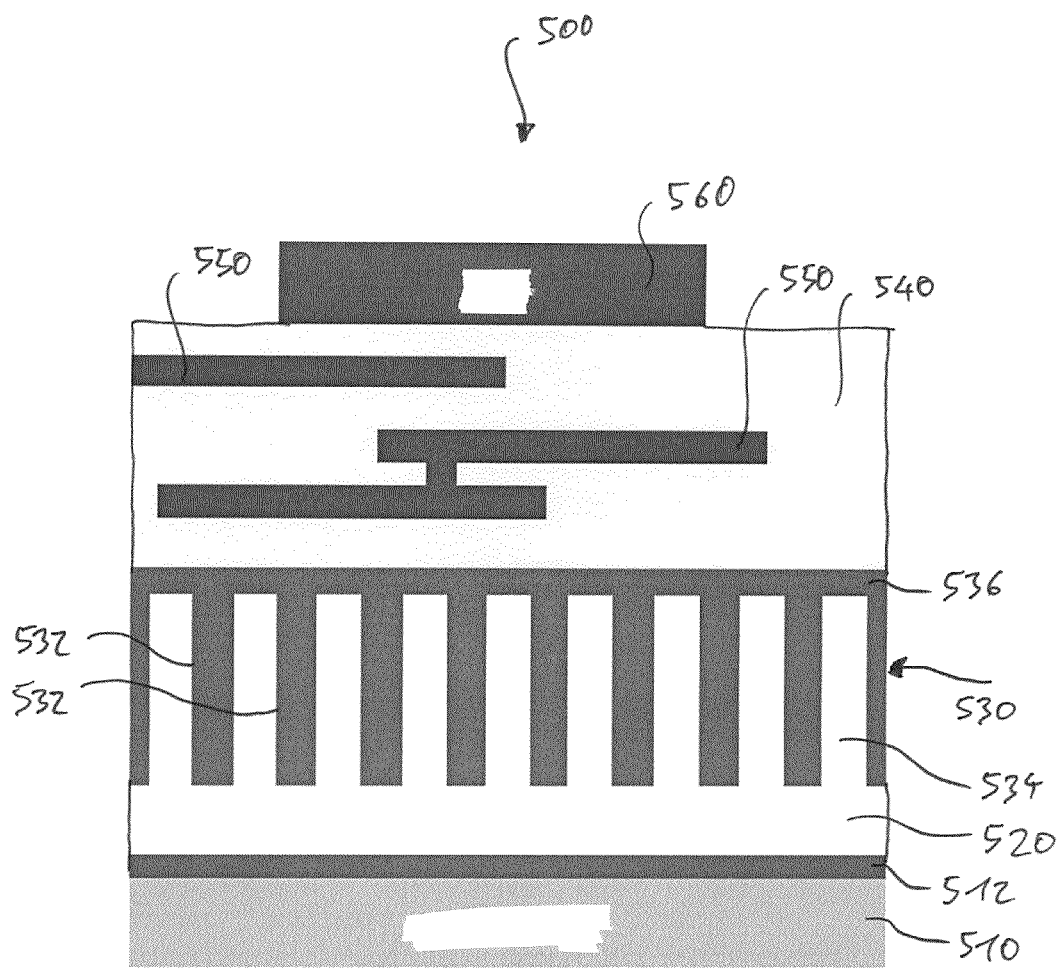
FIG. 5 shows a schematic cross-section of a semiconductor device.

FIG. 5 shows a semiconductor device 500 according an embodiment. The schematic cross section shows a detail of a decoupling region with an array 530 of lamellas. In this area, the semiconductor device 500 comprises a bulk silicon 510 with a silicon oxide layer 512 on top. The silicon oxide layer 512 is followed by a common lateral cavity 520 (e.g. silicon-on-nothing cavity). The array 530 of lamellas is arranged above the common lateral cavity 520. The array 530 of lamellas comprises an alternating order of lamellas 532 and cavities 534 in the lateral direction. The array 530 of lamellas is covered by a silicon dioxide layer 536 (e.g. high-density plasma oxide or tetraethyl orthosilicate oxide). The sealing layer 536 is followed by a number of inter metal oxide layers 540 and metal layers 550 representing the metallization. Further, a pad 560 (e.g. for connecting the semiconductor device to external devices) is arranged on top of the metallization.

Due to the array 530 of lamellas as well as the common lateral cavity 520, the capacity between the metal layers 550 and/or the pad 560 at one side and the bulk silicon 510 at the other side is significantly reduced in comparison to a device without such a decoupling structure (e.g. with silicon substrate in between).

The example shown in FIG. 5 may illustrate a vertical decoupling when used (the array of lamellas) underneath wiring (part of a metal layer) and pad regions.

For example, the illustrated structure or a structure mentioned before may be suited to provide a decoupling (or a reduction of the coupling) also for antenna switches or other electric devices. In the example shown in FIG. 5, a vertical decoupling between metallization and bulk silicon 510 may be provided.

Some embodiments may relate to a structure and fabrication of a low-k composite structure for decoupling of capacitive device elements. Such a low-k composite structure may be built up by an array of lamellas mentioned above.

The introduced structure may provide an extensive decoupling of parasitic elements. Such a decoupling structure may avoid the requirement of a low-k inter metal dielectric for reduction of wire-to-wire or wire-to-bulk crosstalk, for example. Alternatively, also a depletion zone in the silicon bulk for reducing pad to bulk crosstalk may be avoided or not required, since silicon comprises a high relative permittivity (11.9) that may bring high coupling even for thick depletion zones.

According to an aspect, a trench etch process is used to provide a field of silicon lamellas. These lamellas undergo a thermal oxidation that consumes all silicon material, for example. After oxidation, the lamella material is silicon dioxide, for example. The trenches in between provide a further reduction of the effective permittivity. A suited sealing process may be an HDP oxide deposition (high-density plasma) or a TEOS oxide process (tetraethyl orthosilicate).

In other words, an aspect is the application of the silicon oxide grid embedded in the silicon bulk (silicon substrate layer) for decoupling of capacitive device elements. In an instance, it may be combined with a silicon-on-nothing cavity to avoid or reduce sheer stress at the bottom of the silicon oxide grid. An appropriate sealing process may be an HDP deposition.

A rough estimation of the decoupling effect of a proposed structure may be given as follows, for example. The interlayer dielectric in the back end of line metallization (BEOL) may be a silicon dioxide with a permittivity of 3.9 and a thickness of 2 to 5 microns, for example. The composite structure may provide a permittivity of approximately 2 and a thickness of 5 to 20 microns, for example. In this way, the vertical decoupling may be improved by a factor of 4 to 20.

The decoupling structure described above may be usable in many different applications. For example, devices with fast varying signals or high switching speed may require structures with high capacitive decoupling capability (e.g. processor with high switching speed or transmitter and/or receiver in communication networks or antenna switches).

Further, also micro-electro-mechanical systems may use a proposed decoupling structure (decoupling region with array of lamellas) for electrically and/or capacitive decoupling of a movable element from the bulk silicon or a silicon layer surrounding the movable element, for example.

For actuators and/or micro-electro-mechanical system elements often a wide air gap is used. For this, a suited integration scheme for a sealing process that simultaneously enables or guarantees a movement of the micro-electro-mechanical system element may be used, for example. By using a proposed structure, a wafer-to-wafer bonding or a thick sacrificial layer process may be avoided.

In some embodiments, the semiconductor device 100 comprises a resonator structure. The resonator structure comprises at least one resonator area and at least one anchor area. The resonator area is arranged next to an electrode for stimulating an oscillation of the resonator structure. Further, the array 130 of lamellas comprises at least one row of lamellas 132 connecting the anchor area laterally to the silicon substrate layer 110.

By using a proposed array 130 of lamellas for connecting the resonator structure laterally to the bulk silicon or the silicon substrate layer 110, a good capacitive and/or electrical decoupling of the resonator structure from the silicon substrate layer 110 and/or the bulk silicon can be provided.

The anchor area of the resonator structure may be used for connecting or hanging up the resonator structure laterally or vertically to a substrate. The at least one resonator area of the resonator structure may be placed in the proximity of an electrode in order to be electrically stimulated.

The geometry of the resonator structure may constitute the resonant frequency of the resonator structure.

Optionally, the resonator structure and the array 130 of lamellas may be arranged above a common lateral cavity so that the resonator structure is connected to neighboring silicon solely by the array 130 of lamellas connected to the anchor region. In other words, the resonator structure may be suspended only or solely by the lamellas 132 of the array 130 of lamellas. In this way, a nearly free movement of the resonator structure as well as a good electrical and/or capacitive decoupling from the surrounding silicon substrate may be provided.

Optionally, additionally or alternatively to one or more aspects mentioned above, the array 130 of lamellas connected to the anchor region may comprise a p-n-junction within the lamellas between the anchor area and the silicon substrate layer 110. In this way, the electrical decoupling through the array 130 of lamellas may be improved, if the lamellas within the array comprise portions of silicon remaining after oxidation.

As already mentioned, the decoupling region 120 may comprise more than one array 130 of lamellas. For example, the decoupling region 120 may comprise at least a further array of lamellas laterally arranged between the at least one resonator area and the silicon substrate layer 110. The lamellas of the further array of lamellas are connected to the silicon substrate layer 110 and extend laterally towards the resonator area without reaching the resonator area. In other words, the lamellas of the further array of lamellas may extend into the lateral gap between the silicon substrate layer 110 and the resonator area, but end with a predefined lateral distance (e.g. at least equal to a maximal movement of the resonator structure) to the resonator area. In this way, the gap between the resonator structure and the lamellas arranged in the predefined distance can be handled easily in the sealing process encapsulating the resonator structure without disturbing a movement of the resonator structure, while the electrical and/or capacitive substrate layer 110 can be kept high.

The resonator structure may be shaped in various ways in order to provide a desired resonant frequency. For example, the resonator structure may comprise a bone shaped geometry with two resonator areas at both ends and the anchor area in between.

FIG. 6a shows the semiconductor device 600 according to an embodiment. The semiconductor comprises a bone shaped footprint with two resonator areas at lateral both ends and the anchor in between. The micro-electro-mechanical resonator is implemented as a longitudinal mode silicon resonator. The resonator structure comprises an anchor area 610. The anchor area 610 connects the otherwise free-standing structure to a bulk silicon (represented by the silicon substrate layer) through an array 640 of lamellas laterally separating the anchor area 610 and the bulk silicon 660. The resonator structure further comprises two resonator areas 620 at opposite ends of the resonator structure and the anchor area 610 in between.

In this way, a bone-shaped or dog bone-shaped footprint may be implemented for the resonator structure. The resonator structure may further comprise two actuation electrodes 630 positioned next to the resonator area 620 with a gap between the respective electrode 630 and the corresponding resonator area 620. In operation, excitation of the resonator may be induced by electrostatic actuation through the electrodes. For example, both an AC voltage (alternating current) and a DC voltage (direct current) may be applied to the electrodes to drive the resonator structure into resonant vibration. Optionally, a sense current may be sent through electrodes arranged at opposite sides of the anchor area 610 so that the sense current flows from one electrode at the anchor area 610 around a trench 612 to the other electrode of the anchor area 610. The resonator structure may be surrounded by a wide trench or gap except for the gaps between the resonator area 620 and the electrode 630 with a comparably narrow gap in between, since the electrodes 630 and the resonator area 620 should be strongly coupled, while the other areas should be electrically and/or capacitively decoupled from the bulk silicon and/or the surrounding silicon substrate layer.

In other words, the decoupling region may extend along the edge of the resonator structure except for the region between the electrodes 630 and the resonator area 620. In this connection, the decoupling region may comprise an array 640 of lamellas connecting the anchor region 610 to the bulk silicon 660 and may comprise a further array 650 of lamellas comprising lamellas connected to the bulk silicon 660 and extending in the direction of the resonator area 620 without connecting the resonator area 620.

As mentioned above, the resonator structure can be connected to the bulk silicon 660 through an area 640 of lamellas as it is shown in a detailed top view as shown in FIG. 6c. Further, a further array 650 of lamellas extending from the bulk silicon 660 into the gap between the bulk silicon 660 and the resonator area 620 may be implemented in order to reduce the efforts for sealing processes, while providing a sufficient electrical and/or capacitive decoupling, as it is shown in FIG. 6b.

In a combination with a micro-electro-mechanical system device, the proposed lamella structure may be used for a lateral decoupling. Two different trench widths may be used when integrating an MEMS resonator. A wide trench 602 to avoid unwanted coupling with bulk material and a narrow trench 604 at electrode regions may be used as shown in FIG. 6a. In other words, FIG. 6a illustrates an MEMS resonator with two different trench widths.

The two different geometries may lead to challenges for sealing processing when a shallow and lean structure may be desired. The wider the trench, the less processes may be suited for deposition or the thicker the sacrificial layer to be used. A crest-shaped geometry (array of lamellas) of the silicon oxide lamella pattern may provide enhanced decoupling and narrow trenches with equal widths for strong coupling at electrode regions and weak coupling at other regions. An example is shown in FIGS. 6b and 6c. The silicon oxide trench structure may simultaneously provide a lateral dielectric isolation at anchor fixtures. In other words, the crest-shaped structure shown in FIGS. 6b and 6c may be used for lateral capacitive decoupling and dielectric isolation of an MEMS resonator, for example.

Figure 6D:
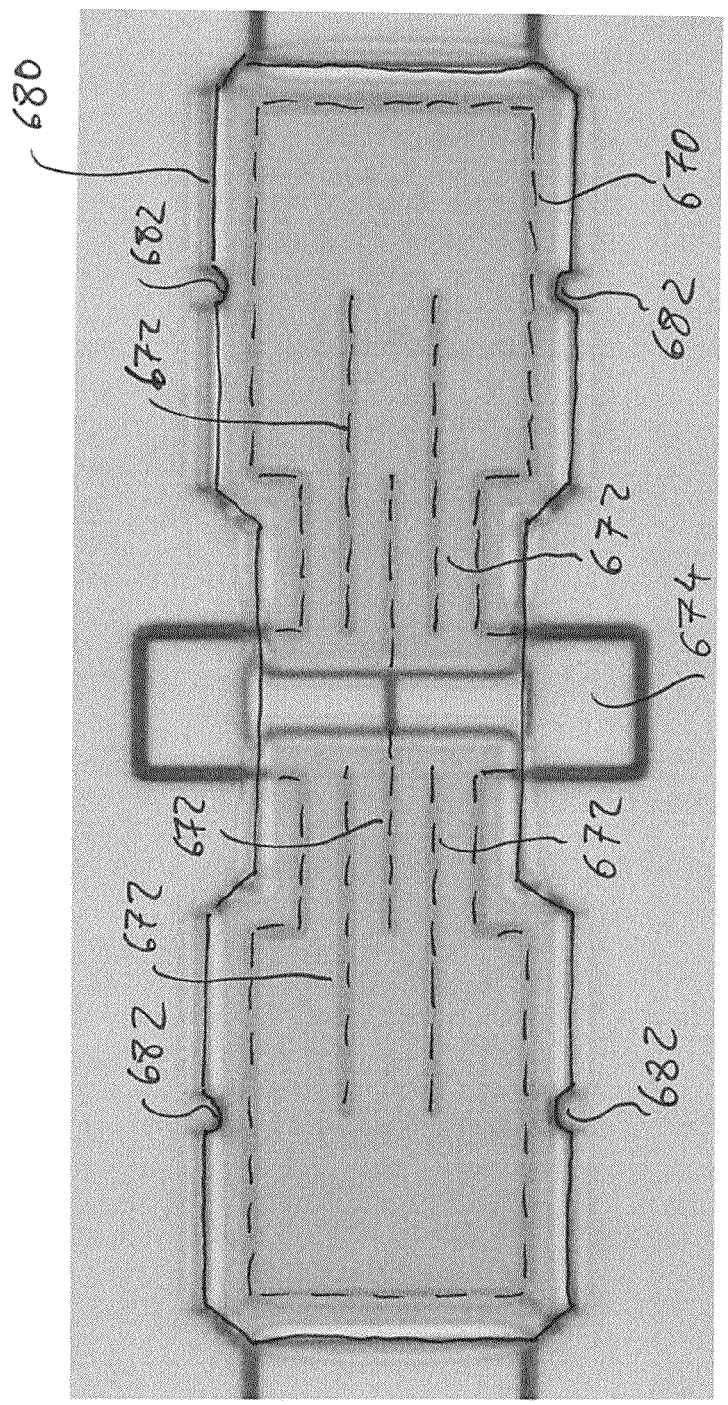
FIG. 6d shows a schematic illustration of a top view of a capsulated resonator structure.

FIG. 6d shows a resonator structure after sealing the bone-shaped resonator structure 670 (indicated by dashed lines) by a sacrificial carbon layer and a remaining nitride layer 680 after removing the carbon layer through holes 682 in the nitride layer 680. In this example, the resonator structure comprises more trenches 672 for enlarging the current path through electrodes at opposite of the anchor region 674 of the resonator structure.

Some embodiments relate to a micro-electro-mechanical resonator. The resonator structure comprises at least one resonator area and at least one anchor area. The resonator area is arranged next to an electrode for stimulating an oscillation of the resonator structure. Further, an array of lamellas with at least one row of lamellas connects the anchor area laterally to a silicon substrate layer surrounding the resonator structure. The resonator structure and the array of lamellas are arranged above a common lateral cavity so that the resonator structure is connected to neighboring silicon solely through the array of lamellas connected to the anchor region.

In this way, a mainly free-standing resonator structure with an array of lamellas above a common lateral cavity can be provided. Further, the resonator structure can be easily electrically and/or capacitively decoupled from the surrounding silicon substrate. Additionally, the proved movability can be improved.

Further optional features corresponding to one or more aspects mentioned in connection with the proposed concept or one or more embodiments above (e.g. the lamellas of the array of lamellas comprise at least 20% silicon dioxide) may be implemented.

Figure 7:
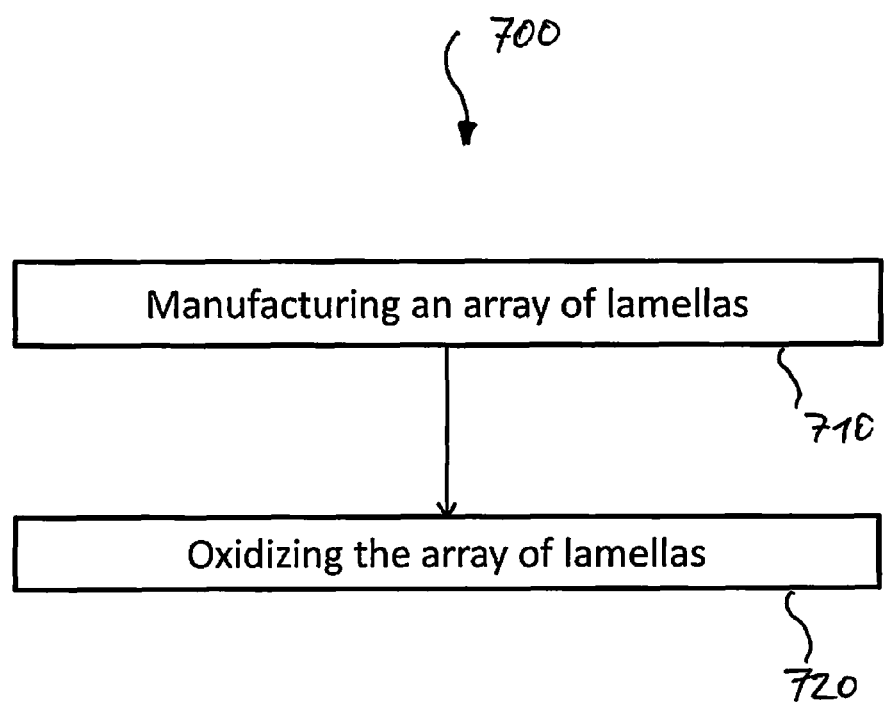
FIG. 7 shows a flowchart of a method for manufacturing a semiconductor device.

FIG. 7 shows a flowchart of a method 700 for manufacturing a semiconductor device according to an embodiment. The method 700 comprises manufacturing 710 an array of lamellas laterally spaced apart from each other by trenches within a decoupling region of a silicon substrate layer. Further, the method comprises oxidizing 720 the array of lamellas so that each lamella of the array of lamellas comprises at least 20% silicon dioxide.

In this way, a semiconductor device according to the described concept or one or more embodiments described above may be easily manufactured.

The array of lamellas with the trenches in between may be manufactured 710 by etching trenches into the silicon substrate layer, for example.

Further, the oxidizing 720 of the lamellas of the array of lamellas may be done by thermal oxidation, for example.

Optionally, the method 700 may further comprise manufacturing a common lateral cavity within the silicon substrate layer before the manufacturing of the array of lamellas. Then, the array of lamellas is manufactured 710 so that the trenches reach the common lateral cavity.

The common lateral cavity may be manufactured in various ways. For example, the buried oxide of a silicon-on-insulator substrate may be etched, if a silicon-on-insulator substrate is used. Alternatively, a silicon germanium layer may be located below the silicon substrate layer, which is removed below the area for implementing the array of lamellas.

Alternatively, also a bulk silicon substrate may be used. In this example, trenches may be etched to the depth of the common lateral cavity to be manufactured. Afterwards, the substrate may be annealed in hydrogen ambient causing a reflow of the substrate leaving cavities at the bottom of the etched trenches. At low pressure and inert ambient, a silicon reflow process may start at moderate temperatures. These cavities can be combined to a large common lateral cavity by a further annealing process. With this manufacturing process, a single crystalline silicon diaphragm above a square-shaped cavity (or another shape) can be manufactured, for example.

Further optionally, the trenches of the array of lamellas may be sealed after oxidation. In other words, the method 700 may further comprise sealing the trenches at an end opposite to a bulk silicon of the semiconductor device (or opposite to an optional common lateral cavity) by an oxide layer (e.g. high-density plasma oxide or tetraethyl orthosilicate oxide) or a carbon layer (e.g. deposited or grown above the trenches).

Additionally, the method 700 may comprise one or more acts for implementing one or more additional, optional features mentioned in connection with the proposed concept or one or more embodiments described above.

Embodiments may further provide a computer program having a program code for performing one of the above methods, when the computer program is executed on a computer or processor. A person of skill in the art would readily recognize that steps of various above-described methods may be performed by programmed computers. Herein, some embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The embodiments are also intended to cover computers programmed to perform the acts of the above-described methods or (field) programmable logic arrays ((F) PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure.

Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A micro-electro-mechanical resonator comprising:
a resonator structure, wherein the resonator structure comprises at least one resonator area and at least one anchor area, wherein the resonator area is arranged next to an electrode for stimulating an oscillation of the resonator structure,
wherein an array of lamellas with at least one row of lamellas connects the anchor area laterally to a silicon substrate layer surrounding the resonator structure,
wherein the resonator structure and the array of lamellas are arranged above a common lateral cavity so that the resonator structure is connected to neighboring silicon solely through the array of lamellas connected to the anchor region.

2. The micro-electro-mechanical resonator according to claim 1, wherein each lamella of the array of lamellas comprises at least 80% silicon dioxide.

3. The micro-electro-mechanical resonator according to claim 1, wherein a lamella of the array of lamellas comprises a lateral length between 200 nm and 10 µm, a lateral thickness between 20 nm and 500 nm and a vertical depth between 500 nm and 100 µm.

4. The micro-electro-mechanical resonator according to claim 1, wherein a cavity laterally separating two neighboring lamellas comprises a lateral width between 50 nm and 1 µm.

5. The micro-electro-mechanical resonator according to claim 1, wherein the array of lamellas comprises rows of lamellas, wherein two neighboring rows of lamellas comprise a lateral offset.

6. The micro-electro-mechanical resonator according to claim 1, wherein the cavities laterally separating the lamellas of the array of lamellas are sealed by a silicon oxide layer or a carbon layer at an end opposite to a bulk silicon of the semiconductor device.

7. The micro-electro-mechanical resonator according to claim 1, wherein cavities laterally separating the lamellas of the array of lamellas are connected to the common lateral cavity at an end facing a bulk silicon of the semiconductor device.

8. The micro-electro-mechanical resonator according to claim 1, wherein the array of lamellas connected to the anchor region comprises a p-n junction within the lamellas between the anchor region and the silicon substrate layer.

* * * * *